United States Patent
Huang et al.

(10) Patent No.: US 9,126,214 B2
(45) Date of Patent: Sep. 8, 2015

(54) SHOWERHEAD

(71) Applicant: HERMES-EPITEK CORPORATION, Taipei (TW)

(72) Inventors: Chien-Ping Huang, Tainan County (TW); Tsan-Hua Huang, Tainan (TW)

(73) Assignee: Hermes-Epitek Corporation, Taipei (TW)

( * ) Notice: Subject to any disclaimer, the term of this patent is extended or adjusted under 35 U.S.C. 154(b) by 283 days.

(21) Appl. No.: 13/920,744

(22) Filed: Jun. 18, 2013

(65) Prior Publication Data
US 2013/0277459 A1 Oct. 24, 2013

Related U.S. Application Data

(62) Division of application No. 12/757,932, filed on Apr. 9, 2010, now Pat. No. 8,484,847.

(30) Foreign Application Priority Data

Feb. 2, 2010 (TW) ................................ 99102945 A

(51) Int. Cl.
| | | |
|---|---|---|
| H01L 21/44 | (2006.01) | |
| H01L 21/465 | (2006.01) | |
| B05B 1/14 | (2006.01) | |
| B23P 15/16 | (2006.01) | |
| B05B 1/18 | (2006.01) | |
| H01L 21/46 | (2006.01) | |
| H01L 21/4757 | (2006.01) | |

(52) U.S. Cl.
CPC ................. *B05B 1/185* (2013.01); *B23P 15/16* (2013.01); *H01L 21/46* (2013.01); *H01L 21/465* (2013.01); *H01L 21/4757* (2013.01); *Y10T 29/49432* (2015.01); *Y10T 29/49433* (2015.01)

(58) Field of Classification Search
CPC ......... B05B 1/185; B23P 15/16; H01L 21/46; H01L 21/465; H01L 21/4757; Y10T 29/49432; Y10T 29/49433
See application file for complete search history.

(56) References Cited

U.S. PATENT DOCUMENTS

| | | |
|---|---|---|
| 6,412,125 B1 | 7/2002 | Ito et al. |
| 6,463,658 B1 | 10/2002 | Larsson |
| 7,846,292 B2 | 12/2010 | Han et al. |
| 2002/0059904 A1 | 5/2002 | Doppelhammer |
| 2003/0000469 A1 | 1/2003 | Pyo |
| 2003/0054099 A1 | 3/2003 | Jurgensen et al. |
| 2005/0001072 A1 | 1/2005 | Bolus et al. |
| 2005/0217580 A1 | 10/2005 | DeDontney et al. |
| 2005/0258280 A1* | 11/2005 | Goto et al. ............... 239/548 |
| 2007/0200013 A1* | 8/2007 | Hsiao ......................... 239/557 |

(Continued)

FOREIGN PATENT DOCUMENTS

| | | |
|---|---|---|
| CA | 2585473 A1 | 10/2007 |
| WO | 0245561 A2 | 6/2002 |

*Primary Examiner* — Alexander P Taousakis
(74) *Attorney, Agent, or Firm* — Donald E. Stout; Stout, Uxa & Buyan, LLP

(57) ABSTRACT

A showerhead is disclosed in this invention. The showerhead includes a bottom portion, at least one plate, and a top portion. The bottom portion includes a plurality of gas tubes which are integratedly formed on the bottom portion. The gas tubes include at least one first gas tube. The at least one plate includes a first plate. The first plate includes a plurality of first openings, wherein the gas tubes pass through the first openings. The top portion is coupled to the bottom portion for forming at least one inner space.

4 Claims, 5 Drawing Sheets

(56) References Cited

U.S. PATENT DOCUMENTS

2009/0211707 A1* 8/2009 Chao et al. ............... 156/345.34
2009/0266911 A1   10/2009 Kim et al.
2011/0048325 A1   3/2011 Choi et al.
2012/0085747 A1*  4/2012 Chao et al. ................. 219/438
2013/0112383 A1*  5/2013 Hanamachi .................. 165/170

* cited by examiner

SHOWERHEAD

CROSS-REFERENCE TO RELATED APPLICATIONS

This application is a divisional of U.S. application Ser. No. 12/757,932, filed on Apr. 9, 2010 and entitled METHOD FOR MAKING A SHOWERHEAD, which claims priority to Taiwan Patent Application No. 099102945, filed on Feb. 2, 2010, the entire contents both of which are incorporated herein by reference.

BACKGROUND OF THE INVENTION

1. Field of the Invention

The present invention generally relates to semiconductor equipment, and more particularly to a showerhead.

2. Description of Related Art

Semiconductor manufacturing equipment is commonly used in the production of semiconductor components. The semiconductor manufacturing equipment typically has a reaction chamber. The reaction gases which are required by the semiconductor manufacturing process can be provided into the reaction chamber by the showerhead of the reaction chamber. FIG. 1 shows a sectional view of a conventional showerhead 100. The conventional showerhead 100 includes a bottom portion 110, a plurality of gas tubes 120, a plate 130, and a top portion 140. Moreover, the conventional showerhead 100 includes a first space 191 and a second space 192, wherein the fluid which flows into the second space 192 can flow into the inside of the reaction chamber. On the other hand, the fluid which flows into the first space 191 will not flow into the inside of the reaction chamber. Therefore, cooling fluid, such as water, can flow into the first space 191 for cooling the conventional showerhead 100.

FIGS. 2A-2F show the making steps of the conventional showerhead 100 shown in FIG. 1. Referring to FIGS. 2A-2C, a bottom portion 110 and a plurality of gas tubes 120 are provided, wherein the bottom portion 110 has a plurality of openings. Then, the gas tubes 120 are inserted into the openings of the bottom portion 110. After that, a soldering process, such as a high temperature soldering process (hard soldering or brazing), is performed for fixing the gas tubes 120 on the openings of the bottom portion 110 and sealing the clearances between the gas tubes 120 and the openings. In the real case, the number of the gas tubes 120 can be thousands. Therefore, the step of inserting the gas tubes 120 into the openings of the bottom portion 110 may cost a long period of time. The quality of the conventional showerhead 100 is affected by the sealing performance of sealing the clearances between the gas tubes 120 and the openings of the bottom portion 110.

Referring to FIGS. 2D-2F, a plate 130 is provided, wherein the plate 130 has a plurality of openings. Then, the gas tubes 120 are inserted into the openings of the plate 130. After that, a soldering process, such as a high temperature soldering process (hard soldering or brazing), is performed for fixing the gas tubes 120 on the openings of the plate 130 and sealing the clearances between the gas tubes 120 and the openings of the plate 130. Finally, the top portion 140 is provided and assembled to the bottom portion 110 so as to finish the making steps of the conventional showerhead 100.

By the needs of the semiconductor process, the conventional showerhead 100 disposed within the reaction chamber has to bear high temperature and corrosion caused by reaction gases, such that the life-time of the conventional showerhead 100 is decreased. For example, high temperature, thermal cycling, and corrosion caused by reaction gases may damage the soldering portions for sealing the clearances between the gas tubes 120 and the openings of the bottom portion 110. The cooling fluid within the first space 191 may leak into the inside of the reaction chamber. Thus, the process yields are affected by the cooling fluid.

For the reason that there are some disadvantages of the prior art mentioned above, there exists a need to propose a novel showerhead. The showerhead has better ability for bearing high temperature, thermal cycling, and corrosion caused by reaction gases. The showerhead has longer life-time, and the cooling fluid will not leak into the inside of the reaction chamber and affect the process yields.

SUMMARY OF THE INVENTION

Accordingly, the present invention has been made in order to meet such a need described above, and it is an object of the present invention to provide a novel showerhead. The showerhead has better ability for bearing high temperature, thermal cycling, and corrosion caused by reaction gases. The showerhead has longer life-time, and the cooling fluid will not leak into the inside of the reaction chamber and affect the process yields.

In order to achieve the above object, the present invention provides a showerhead. The showerhead includes a bottom portion, at least one plate, and a top portion. The bottom portion includes a plurality of gas tubes which are integratedly formed on the bottom portion. The gas tubes include at least one first gas tube. The at least one plate includes a first plate. The first plate includes a plurality of first openings, wherein the gas tubes pass through the first openings. The top portion is coupled to the bottom portion for forming at least one inner space.

According to the showerhead of the present invention, gas tubes are integratedly formed on the bottom portion. There are no clearances between the gas tubes and the bottom portion, such that the leakage caused by clearances between the gas tubes and the bottom portion is avoided. Therefore, the showerhead has better ability for bearing high temperature, thermal cycling, and corrosion caused by reaction gases. Thus, the showerhead has longer life-time, and the cooling fluid will not leak into the inside of the reaction chamber.

DETAILED DESCRIPTION OF THE INVENTION

The detailed description of the present invention will be discussed in the following embodiments, which are not intended to limit the scope of the present invention, and can be adapted for other applications. While drawings are illustrated in detail, it is appreciated that the quantity of the disclosed components may be greater or less than that disclosed, except where expressly restricting the amount of the components.

Figure 1:
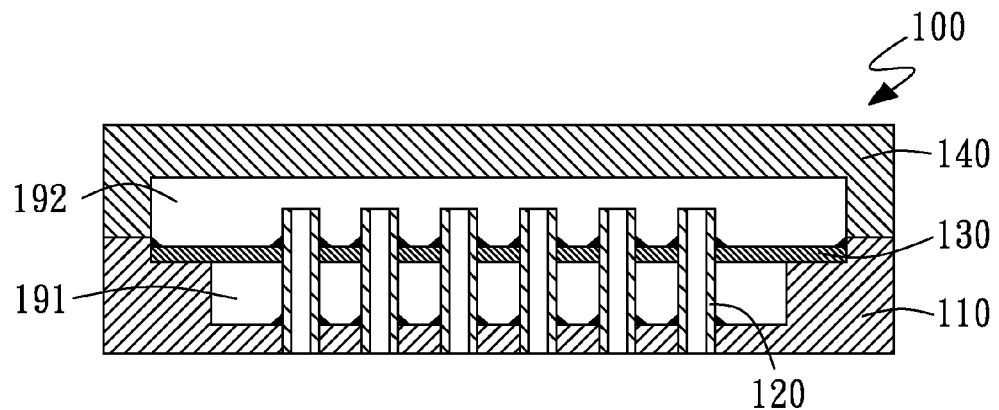
FIG. 1 shows a sectional view of a conventional showerhead.
Figure 2A:
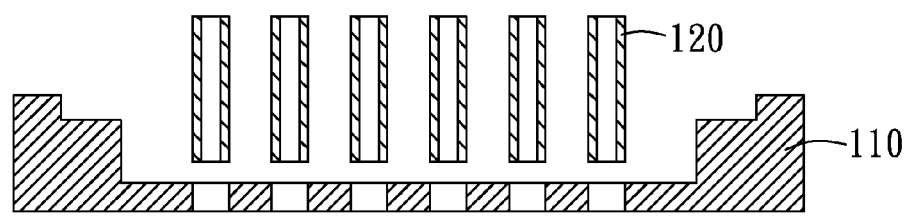
FIGS. 2A-2F show the making steps of the conventional showerhead shown in FIG. 1.
Figure 2B:
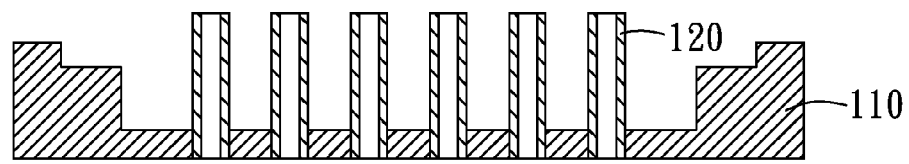
Figure 2C:
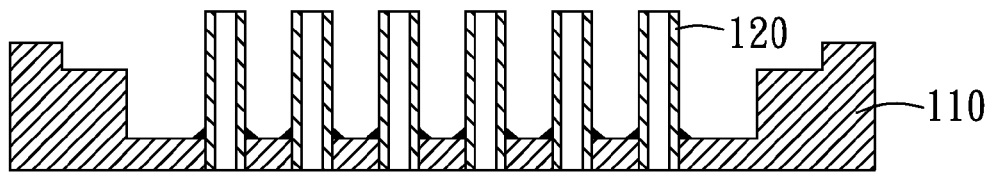
Figure 2D:
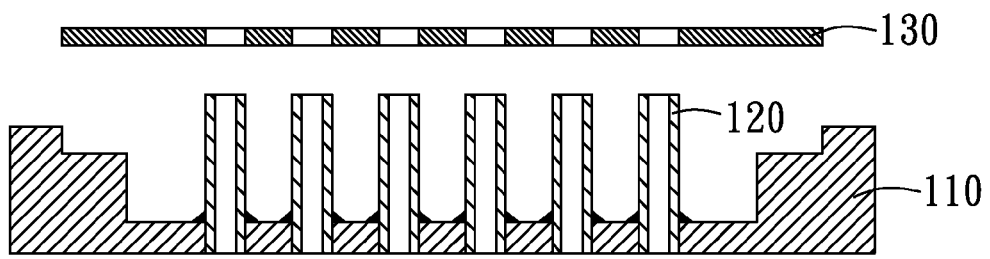
Figure 2E:
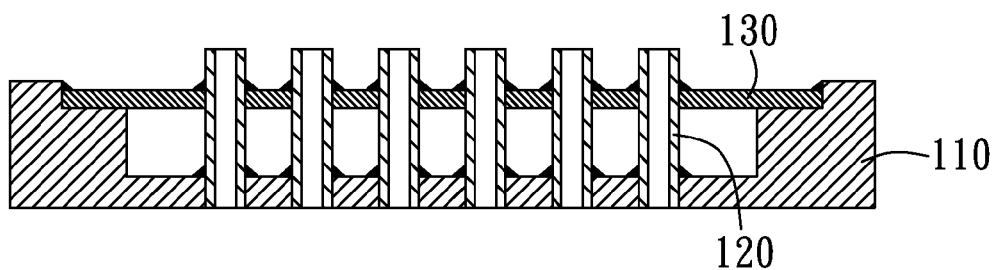
Figure 2F:
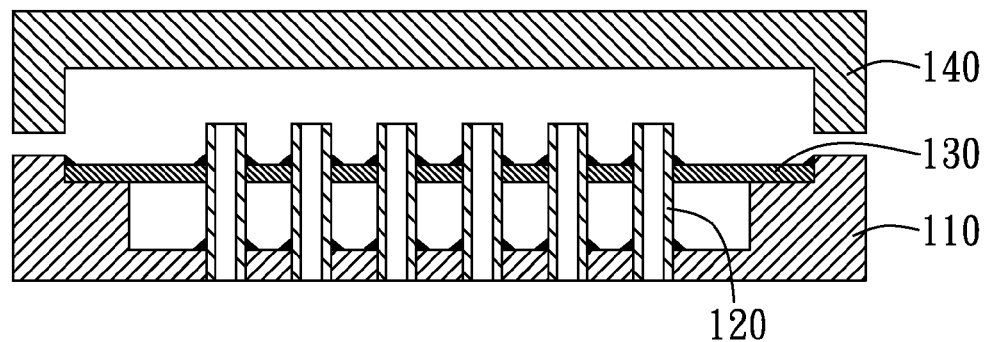
Figure 3:
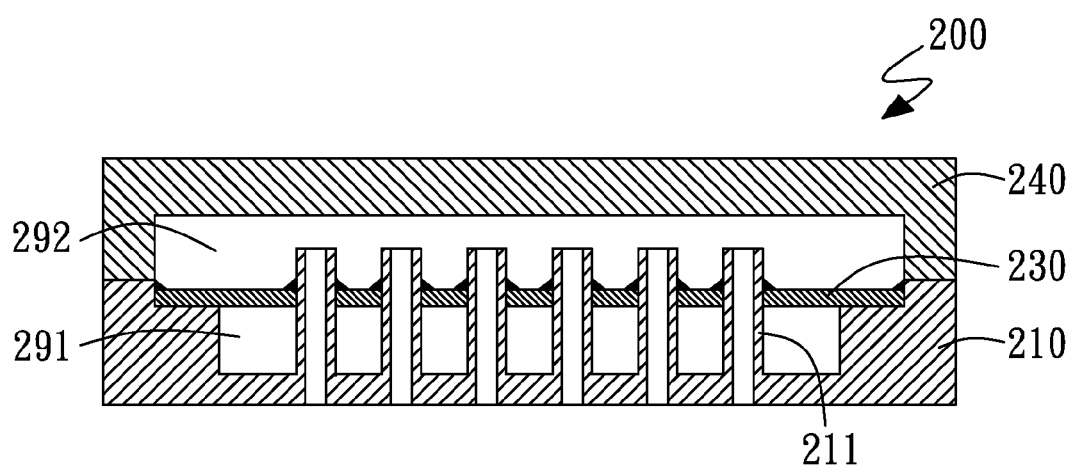
FIG. 3 shows a sectional view of the showerhead in accordance with an embodiment of the present invention.

FIG. 3 shows a sectional view of a showerhead 200 in accordance with an embodiment of the present invention. The showerhead 200 includes a bottom portion 210, a plate 230, and a top portion 240. The bottom portion 210 includes a plurality of gas tubes 211 which are integratedly formed on the bottom portion 210. The plate 230 includes a plurality of openings, wherein the gas tubes 211 pass through the openings of the plate 230. The clearances between the gas tubes 211 and the openings of the plate 230 are sealed by a soldering process. The top portion 240 is connected to the bottom portion 210.

Moreover, the showerhead 200 includes a first space 291 and a second space 292, wherein the fluid which flows into the second space 292 can flow into the inside of a reaction chamber through the gas tubes 211. On the other hand, the fluid which flows into the first space 291 will not flow into the inside of the reaction chamber. Therefore, cooling fluid, such as water, can flow into the first space 291 for cooling the showerhead 200.

In this embodiment, the gas tubes 211 are integratedly formed on the bottom portion 210 by a mechanical process, wherein the mechanical process can include many kinds of processing methods, such as machining, electric discharge machining, casting, or any other processing method. Any processing method which is capable of integratedly forming the gas tubes 211 on the bottom portion 210 is possible to be used. Different processing methods should be considered based on the real conditions. Although the mechanical process is used in this embodiment, the gas tubes can also be integratedly formed on the bottom portion 210 by a chemical process or another processing method.

Figure 4A:
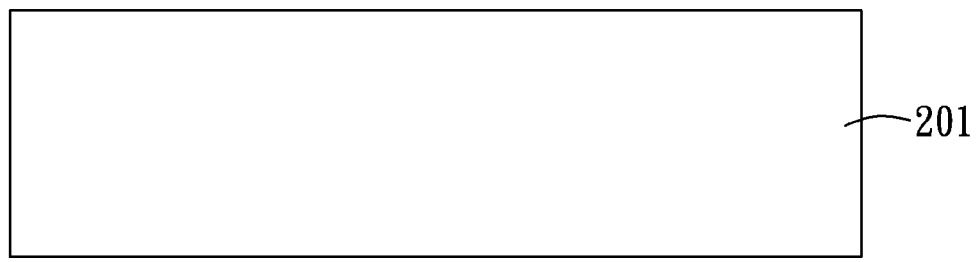
FIGS. 4A-4E show the making steps of the showerhead shown in FIG. 3.
Figure 4B:
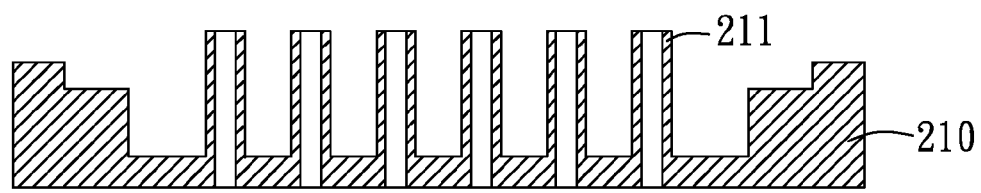

FIGS. 4A-4E show the making steps of the showerhead shown in FIG. 3. Referring to FIGS. 4A and 4B, a bottom portion material 201 is provided. Then, a bottom portion 210 is formed from the bottom portion material 201. The bottom portion 210 has a plurality of gas tubes 211, wherein the gas tubes 211 are integratedly formed on the bottom portion 210. In this embodiment, the gas tubes 211 are integratedly formed on the bottom portion 210 by a mechanical process, wherein the mechanical process can include many kinds of processing methods, such as machining, electrical discharge machining, casting, or any other processing method. Any processing method which is capable of integratedly forming the gas tubes 211 on the bottom portion 210 is possible to be used. Different processing methods should be considered based on the real conditions. Although the mechanical process is used in this embodiment, the gas tubes can also be integratedly formed on the bottom portion 210 by a chemical process or another processing method.

Figure 4C:
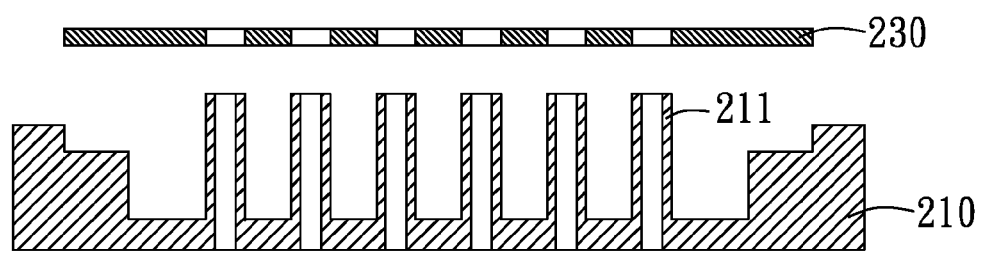
Figure 4D:
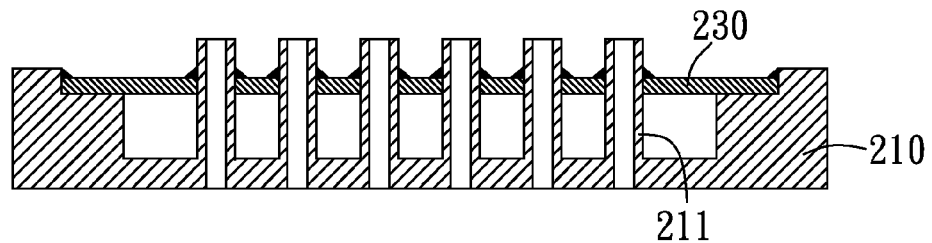
Figure 4E:
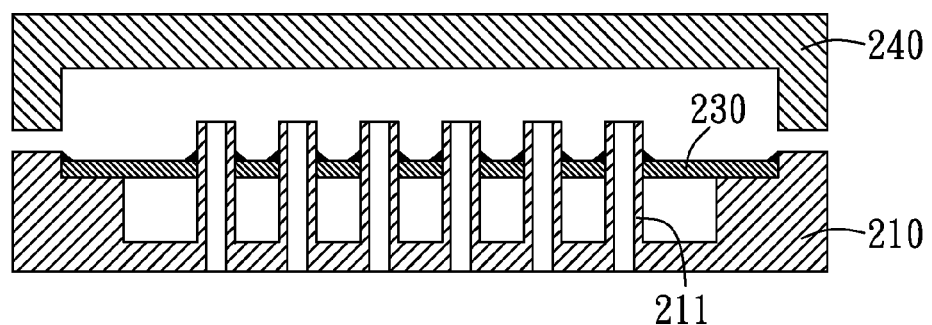

Referring to FIGS. 4C-4E, a plate 230 is provided and assembled, wherein the plate 230 has a plurality of openings, and the gas tubes 211 are inserted into the openings of the plate 230. Then, a soldering process, such as a high temperature soldering process (hard soldering or brazing), is performed for fixing the plate 230 and sealing the clearances between the gas tubes 211 and the openings of the plate 230. Finally, a top portion 240 is provided and assembled to the bottom portion 210 so as to finish the making steps of the showerhead 200.

Figure 5:
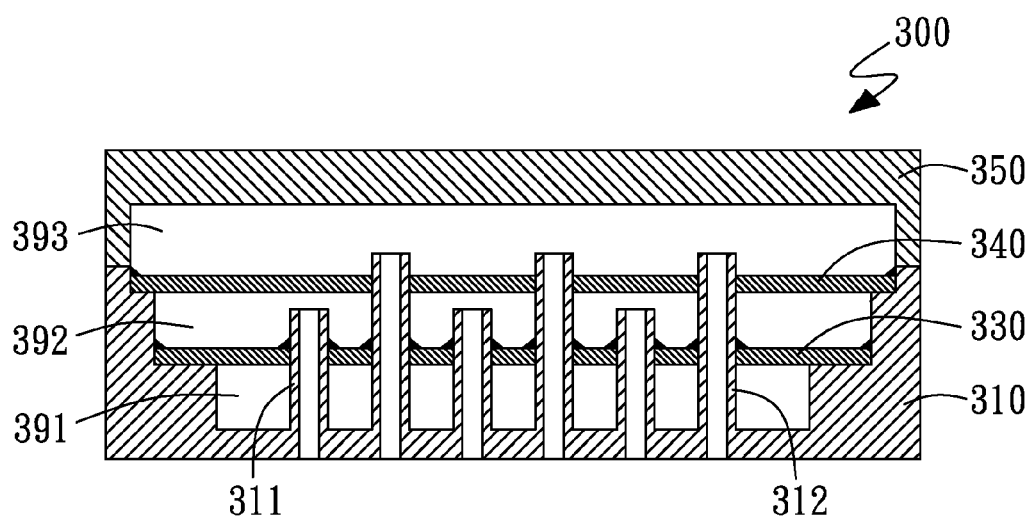
FIG. 5 shows a sectional view of the showerhead in accordance with another embodiment of the present invention.

FIG. 5 shows a sectional view of a showerhead 300 in accordance with another embodiment of the present invention. The showerhead 300 includes a bottom portion 310, a first plate 330, a second plate 340, and a top portion 350. Moreover, the showerhead 300 includes a first space 391, a second space 392, and a third space 393. The fluid which flows into the first space 391 will not flow into the inside of a reaction chamber. Therefore, cooling fluid, such as water, can flow into the first space 391 for cooling the showerhead 300.

The bottom portion 310 includes at least one first gas tube 311 and at least one second gas tube 312, wherein the first gas tube 311 and the second gas tube 312 are integratedly formed on the bottom portion 310. The first gas tube 311 and the second gas tube 312 have different lengths. The second gas tube 312 passes through the first opening of the first plate 330 and the second opening of the second plate 340. Thus, the second gas tube 312 reaches the third space 393. The fluid which flows into the third space 393 can flow into the inside of a reaction chamber through the second gas tube 312. The first gas tube 311 passes through the first opening of the first plate 330 and reaches the second space 392. The fluid which flows into the second space 392 can flow into the inside of a reaction chamber through the first gas tube 311.

In this embodiment, the showerhead 300 includes a first space 391, a second space 392, and a third space 393, but is not limited to this. According to the same design concept, by using gas tubes having different lengths, the showerhead 300 can include a plurality of space based on the real needs.

According to the showerhead of the present invention, gas tubes are integratedly formed on the bottom portion. There are no clearances between the gas tubes and the bottom portion, such that the leakage caused by clearances between the gas tubes and the bottom portion is avoided. Therefore, the showerhead has better ability for bearing high temperature, thermal cycling, and corrosion caused by reaction gases. Thus, the showerhead has longer life-time, and the cooling fluid will not leak into the inside of the reaction chamber.

Although specific embodiments have been illustrated and described, it will be appreciated by those skilled in the art that various modifications may be made without departing from the scope of the present invention, which is intended to be limited solely by the appended claims.

What is claimed is:

1. A showerhead, comprising:
   a bottom portion, said bottom portion having a plurality of gas tubes, wherein said gas tubes are integratedly formed on said bottom portion, said gas tubes comprises at least one first gas tube;
   at least one plate, said plate comprising a first plate, said first plate having a plurality of first openings, wherein said gas tubes pass through said first openings; and
   a top portion, wherein said top portion is coupled to the bottom portion for forming at least one inner space;
   wherein said at least one plate further comprises a second plate, said second plate has a plurality of second openings, said gas tubes comprises at least one first gas tube and at least one second gas tube, said first gas tube and said second gas tube have different lengths, said second gas tube passes through said first opening and said second opening, said first gas tube passes through said first opening, said first gas tube does not pass said second opening.

2. The showerhead according to claim 1, wherein said gas tubes are integratedly formed on said bottom portion by a mechanical process.

3. The showerhead according to claim 1, wherein said gas tubes are integratedly formed on said bottom portion by a chemical process.

4. The showerhead according to claim 1, wherein the clearances between said gas tubes and said first openings are sealed by a brazing process.

* * * * *